(12) United States Patent
Jin et al.

(10) Patent No.: US 12,525,742 B2
(45) Date of Patent: Jan. 13, 2026

(54) ELECTRICAL CONNECTION STRUCTURES FOR A SIGNAL CONNECTOR

(71) Applicant: Robert Bosch GmbH, Stuttgart (DE)

(72) Inventors: Hao Jin, Jiangsu (CN); Wendy Wang, Jiangsu (CN)

(73) Assignee: Robert Bosch GmbH, Stuttgart (DE)

( * ) Notice: Subject to any disclaimer, the term of this patent is extended or adjusted under 35 U.S.C. 154(b) by 365 days.

(21) Appl. No.: 17/990,814

(22) Filed: Nov. 21, 2022

(65) Prior Publication Data

US 2023/0163508 A1 May 25, 2023

(30) Foreign Application Priority Data

Nov. 19, 2021 (CN) .......................... 202122861641.4

(51) Int. Cl.
*H01R 12/72* (2011.01)

(52) U.S. Cl.
CPC .................................. *H01R 12/724* (2013.01)

(58) Field of Classification Search
CPC .......................... H01R 13/748; H01R 13/6315
USPC ......................................................... 439/246
See application file for complete search history.

(56) References Cited

U.S. PATENT DOCUMENTS

| | | | | |
|---|---|---|---|---|
| 4,723,196 A * | 2/1988 | Hofmeister | .......... | H05K 7/1428 361/740 |
| 5,584,704 A * | 12/1996 | Romann | .............. | H01R 12/778 439/130 |
| 6,012,418 A * | 1/2000 | Bodenhausen | ...... | F02M 51/005 123/456 |
| 6,436,287 B1 * | 8/2002 | Fischerkeller | ......... | F02M 37/50 210/232 |
| 6,688,331 B2 * | 2/2004 | Demersseman | ........ | B60T 11/26 285/124.1 |
| 6,759,783 B2 * | 7/2004 | Hager | .................. | H02K 7/1166 310/239 |
| 7,234,950 B1 * | 6/2007 | Wickett | ............... | H05K 5/0069 439/247 |
| 8,890,515 B2 * | 11/2014 | Braun | .................... | G01D 5/145 324/207.25 |
| 9,099,828 B2 * | 8/2015 | Kaesser | ............... | H01R 13/504 |
| 10,098,267 B1 * | 10/2018 | Janson | ................. | H05K 9/0067 |
| 10,483,687 B2 * | 11/2019 | Yamashita | ............. | H02G 3/088 |

(Continued)

FOREIGN PATENT DOCUMENTS

WO WO-2018116563 A1 * 6/2018 ............. H01R 12/62

*Primary Examiner* — Marcus E Harcum
(74) *Attorney, Agent, or Firm* — Michael Best & Friedrich LLP

(57) ABSTRACT

A signal connector comprises: a first part, having at least one electrical contact part, and a first body configured to be electrically insulating; a second part, having at least one electrical pin, and a second body configured to be electrically insulating and separate from the first body, and the electrical pin is configured to protrude from the second body; and an electrical connection body, extending from each electrical contact part to each electrical pin, in order to establish an electrical connection between the electrical contact part and the electrical pin, wherein the electrical connection body is configured to be deformable and comprises at least two bending parts, and at least part of the electrical connection body is located outside the first part and the second part, such that the position of the second part relative to the first part is variable.

10 Claims, 3 Drawing Sheets

(56) References Cited

U.S. PATENT DOCUMENTS

| | | | |
|---|---|---|---|
| 2005/0105280 A1* | 5/2005 | Doll | G06F 1/183 |
| | | | 439/246 |
| 2010/0128122 A1* | 5/2010 | Wright | H04N 23/55 |
| | | | 348/E5.022 |
| 2013/0038724 A1* | 2/2013 | McCormick | F16M 11/10 |
| | | | 348/143 |
| 2013/0066514 A1* | 3/2013 | Das | G07C 5/008 |
| | | | 701/31.5 |
| 2015/0082875 A1* | 3/2015 | Beyrich | F02M 35/10386 |
| | | | 73/114.32 |
| 2022/0271474 A1* | 8/2022 | Linseder | H01R 31/06 |

* cited by examiner

ELECTRICAL CONNECTION STRUCTURES FOR A SIGNAL CONNECTOR

BACKGROUND OF THE INVENTION

The present application relates to the field of electrical connection structures.

An integrated signal connector is commonly used for attachment to a circuit board, with an electrical connection being formed by a press-fit between the signal connector and the circuit board. During fitting, the relative positions of the signal connector and circuit board are affected by several dimensional tolerances, so it is necessary to precisely position the signal connector and circuit board.

SUMMARY OF THE INVENTION

The objective of one aspect of the present application is to provide a signal connector that pro-vides a simple and reliable electrical connection solution.

The objective of the present application is achieved by a signal connector, comprising: a first part, having at least one electrical contact part, and comprising a first body, wherein the first body is configured to be electrically insulating;
  a second part, having at least one electrical pin, and comprising a second body, wherein the second body is configured to be electrically insulating and separate from the first body, and the electrical pin is configured to protrude from the second body; and
  an electrical connection body, extending from each electrical contact part to each electrical pin, in order to establish an electrical connection between the electrical contact part and the electrical pin, wherein the electrical connection body is configured to be deformable and comprises at least two bending parts, and at least part of the electrical connection body is located outside the first part and the second part, such that the position of the second part relative to the first part is variable.

In the signal connector, optionally, the first part comprises:
  a socket interface, configured to be suitable for accommodating an electrical plug, the electrical contact part being disposed in the socket interface; and
  a fitting part, configured to match a mounting hole in a housing, in order to fix the first part in place, wherein the second part and the electrical connection body are dimensionally configured to be suitable for passing through the mounting hole before the fitting part is mated with the mounting hole, and wherein the electrical contact part, the electrical connection body and the electrical pin are configured as a single piece.

In the signal connector, optionally, the electrical connection body is further configured such that: the second part is rotatable relative to the first part at least within a certain angular range.

In the signal connector, optionally, the first part further comprises one or more bolt hole, the bolt hole being configured to fix the first part to the housing.

In the signal connector, optionally, the second part further comprises:
  at least one first guide pin, the first guide pin protruding from the second body, wherein the first guide pin and the electrical pin are positioned to be spaced apart, and extend perpendicularly relative to a surface of the second body.

In the signal connector, optionally, the second part further comprises:
  at least one second guide pin, the second guide pin protruding from the second body, wherein the second guide pin and the electrical pin are positioned to be spaced apart, and extend perpendicularly relative to a surface of the second body.

In the signal connector, optionally, the second guide pin is configured to have a different cross-sectional shape from that of the first guide pin,
  wherein the cross-sectional shapes of the first guide pin and the second guide pin are each configured to be one of the following: rectangular, cross-shaped, triangular, circular, elliptical, prism-shaped or a combination thereof.

In the signal connector, optionally, the first guide pin and the second guide pin are respectively shape-configured to match a first guide hole and a second guide hole on a circuit board, such that a press-fit is formed between the electrical pin and an electrical interface on the circuit board, in order to establish an electrical connection between the electrical contact part and the circuit board.

In the signal connector, optionally, the second part comprises four electrical pins, which are positioned on the same straight line.

In the signal connector, optionally, the electrical connection body is configured to comprise one of the following: a flexible connecting wire and a deformable conductor.

BRIEF DESCRIPTION OF THE DRAWINGS

The present application is described in further detail below with reference to the drawings and preferred embodiments. Those skilled in the art will understand that these drawings are drawn merely for the purpose of explaining preferred embodiments, and should therefore not be regarded as limiting the scope of the present application. Furthermore, unless specifically indicated, the drawings are merely intended to conceptually show the composition or structure of the described subject, and may include exaggerated display. Also, the drawings are not necessarily drawn to scale.

DETAILED DESCRIPTION

Figure 1:
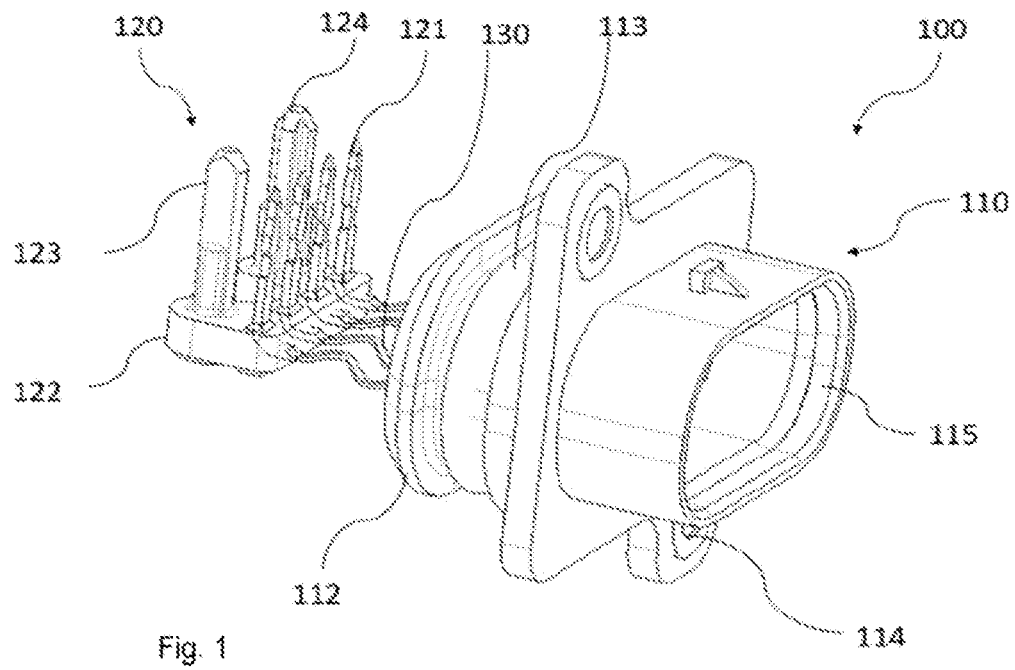
FIG. 1 is a three-dimensional view of an embodiment of the signal connector of the present application.

Preferred embodiments of the present application are described in detail below with reference to the drawings. Those skilled in the art will understand that these descriptions are purely descriptive and demonstrative, and should not be construed as limiting the scope of protection of the present application.

Firstly, it must be explained that orientational terms such as top, bottom, upwards and down-wards as mentioned herein are defined with respect to the directions in the drawings. These orienta-tions are relative concepts, and will therefore vary according to their position and state. Thus, neither these nor any other orientational terms should be construed as being limiting.

In addition, it should also be pointed out that with regard to any individual technical features described or implied in the embodiments herein or any individual technical features shown or implied in the drawings, these technical features (or their equivalents) can be further combined to obtain other embodiments not directly mentioned herein.

It should be noted that identical reference labels in different drawings indicate identical or substantially identical components.

FIG. 1 is a three-dimensional view of an embodiment of the signal connector of the present application. As shown in the figure, the signal connector 100 substantially comprises a first part 110, a second part 120 and an electrical connection body 130. The electrical connection body 130 is connected between the first part 110 and the second part 120, and at least part of the electrical connection body 130 is located outside the first part 110 and second part 120.

The first part 110 comprises at least one electrical contact part 111. The electrical contact part 111 may be an electrical contact, and may be disposed in a socket interface 115. The socket interface 115 may be an interface of any suitable shape, and is matched to an electrical plug which is not shown. The first part 110 comprises a first body 112, and the first body 112 may be configured to be electrically insulating. The first part 110 may further comprise a fitting part 113. As described in more detail below, the fitting part 113 may be dimensionally configured to match a mounting hole in a housing. In the embodiment shown, the fitting part 113 comprises a groove and a rubber ring. In other embodiments, the fitting part may have a suitable mating structure or sealing structure. The first part 110 may further comprise one or more bolt hole 114. As described in more detail below, the bolt hole 114 may be used for fixing the first part 110 to the housing.

The second part 120 comprises at least one electrical pin 121. The electrical pin 121 may be disposed on a second body 122, e.g. may extend perpendicularly from an upper surface of the second body 122. The second body 122 may be configured to be electrically insulating. At least one first guide pin 123 and at least one second guide pin 124 may also be attached to the second body 122. The first guide pin 123 and second guide pin 124 may be configured to be spaced apart in parallel with the electrical pin 121, and may also be configured to extend perpendicularly from the upper surface of the second body 122. In the embodiment shown, the second part 120 comprises four electrical pins 121, which are substantially arranged on the same straight line. Although not shown, it will be easily understood that each of the electrical pins 121 may be attached to the electrical connection body 130 inside the second body 122. In the embodiment shown, the first body 112 and second body 122 are configured to be separate from one another.

The electrical connection body 130 may be any suitable material or structure, including but not limited to a flexible circuit, deformable conductive wire, coaxial conductive wire, etc. The electrical connection boy 130 has one end attached to the electrical pin 121 and another end attached to the electrical contact part 111, in order to establish an electrical connection between the electrical contact part 111 and the electrical pin 121. In one embodiment, the electrical contact part 111, electrical connection body 130 and electrical pin 121 may be configured as a single piece, e.g. may be integrally formed of metal. In one embodiment, the electrical connection body 130 is configured to be deformable, such that the second part 120 is movable relative to the first part 110. Specifically, the second part 120 can change position relative to the first part 110 within a certain range in the plane in which the electrical connection body 130 lies. In another embodiment, the second part 120 can rotate relative to the first part 110 within a certain angular range. Although the electrical connection body 130 is shown as being bent in FIG. 1, the electrical connection body may in fact have one of the following shapes: substantially linear, helical, curved, or a combination of these. In one embodiment, the electrical connection body 130 comprises at least two bending parts, so that the shape of the electrical connection body 130 in space can change, thus facilitating adjustment of the relative positions of the first part 110 and second part 120.

Figure 2:
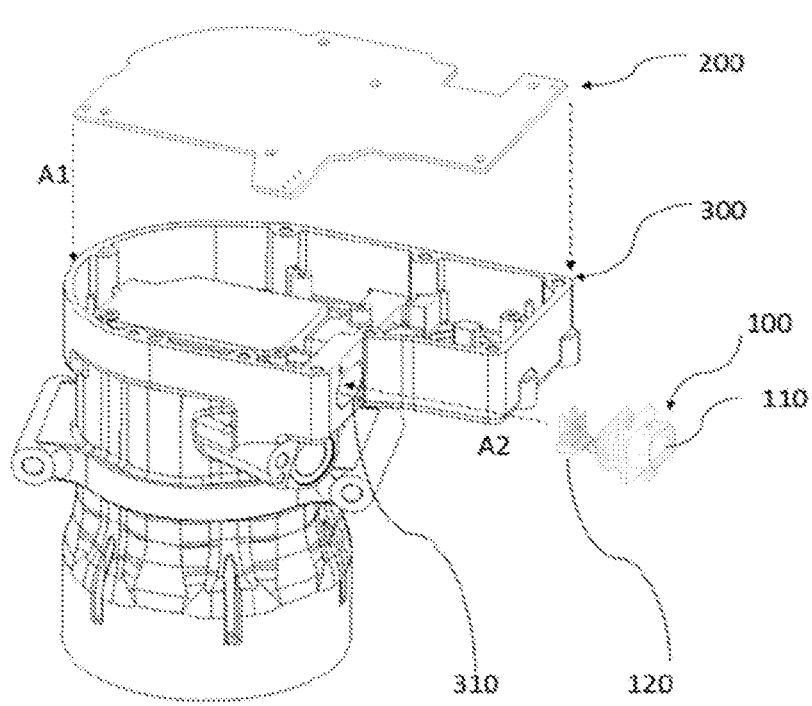
FIG. 2 is an exploded view of the embodiment shown in FIG. 1 during mounting.

FIG. 2 is an exploded view of the embodiment shown in FIG. 1 during mounting. As shown in the figure, a mounting hole 310 is provided in a housing 300, and a circuit board 200 may be accommodated in the housing 300. For example, the circuit board 200 may be inserted into the housing 300 in the direction indicated by the dotted line A1. The signal connector 100 as disclosed above may be inserted through the mounting hole 310, and the second part 120 and electrical connection body 130 are dimensionally configured to be able to pass through the mounting hole 310, such that the fitting part 113 of the first part 110 can be fitted into the mounting hole 310. In addition, at least one first guide hole and at least one second guide hole may be provided on the circuit board 200. The first guide hole may be dimensionally configured to match the first guide pin 123, and the second guide hole may be dimensionally configured to match the second guide pin. An electrical interface may also be provided on the circuit board 200; the electrical interface may be dimensionally configured to match the electrical pin 121. For example, the electrical interface may be a through-hole with an inner wall covered with an electrically conductive metal layer.

Figure 3:
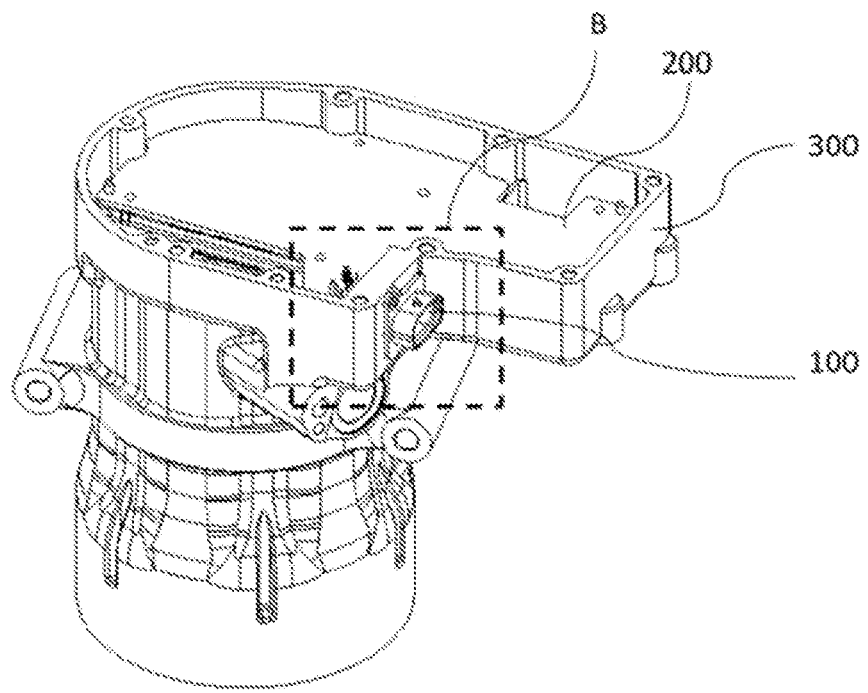
FIG. 3 is an exploded view of the embodiment shown in FIG. 1 after mounting in place.
Figure 4:
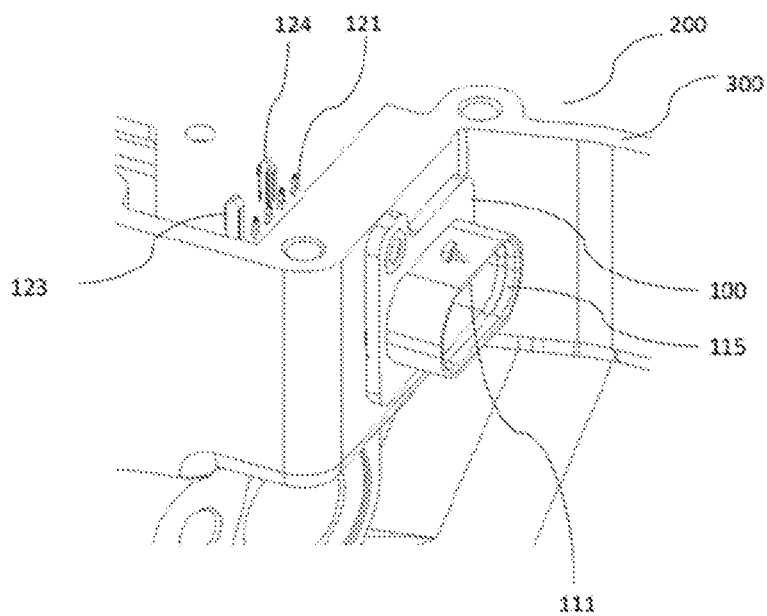
FIG. 4 is a partial enlarged view of the embodiment shown in FIG. 3.

FIG. 3 is an exploded view of the embodiment shown in FIG. 1 after completion of mounting, and FIG. 4 is a partial enlarged view of the embodiment shown in FIG. 3. As shown in the figures, when the signal connector 100 is mounted in place, the fitting part 113 of the first part 110 is fitted in the mounting hole 310, and the first part 110 may also be fixed to the housing 300 by one or more bolt. The bolt may for example be inserted in the bolt hole 114. In addition, the electrical pin 121, first guide pin 123 and second guide pin 124 of the second part 120 are each fitted to the circuit board 200. In addition, the electrical contact part 111 is also shown in FIG. 4, the electrical contact part 111 being located in the socket interface 115.

Figure 5:
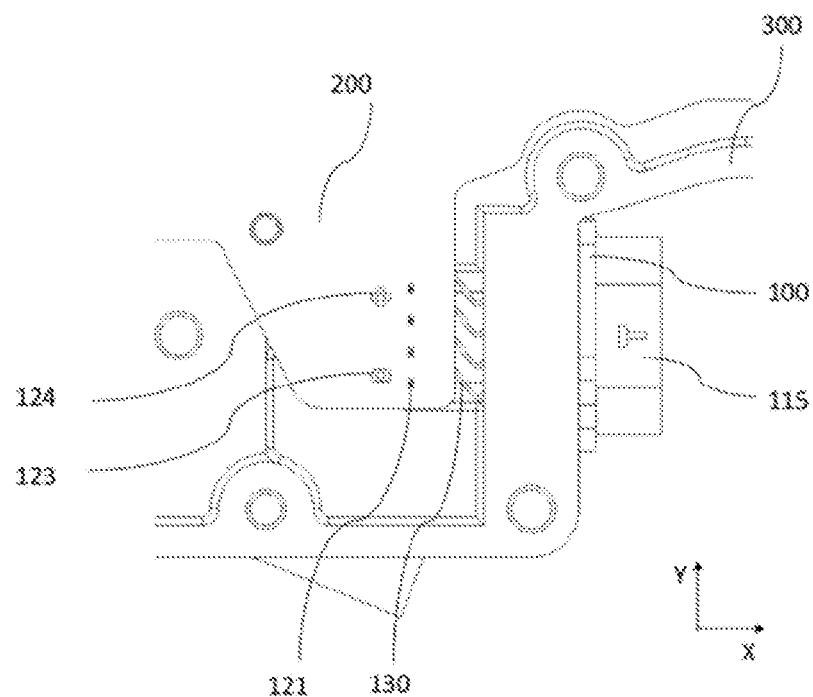
FIG. 5 is a partial top view of the embodiment shown in FIG. 3.
Figure 6:
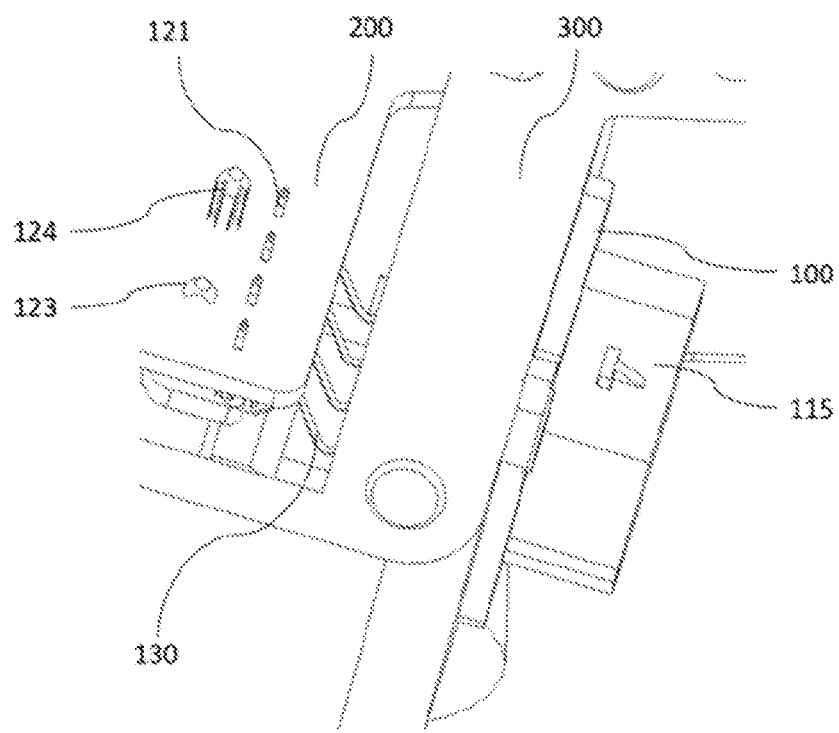
FIG. 6 is a three-dimensional view of the embodiment shown in FIG. 5.

FIG. 5 is a partial top view of the embodiment shown in FIG. 3, and FIG. 6 is a three-dimensional view of the embodiment shown in FIG. 5. As shown in the figures, the first guide pin 123 and second guide pin 124 may have different cross-sectional shapes. In one embodiment, the first guide pin 123 and second guide pin 124 may have one of the following cross-sectional shapes: rectangular, cross-shaped, triangular, circular, elliptical, prism-shaped, or a combination of these, etc. In one embodiment, the different cross-sectional shapes of the first guide pin 123 and second guide pin 124 facilitate positioning of the second part 120, and prevent mounting in the wrong position. A press-fit may be formed between the electrical pin 121 and the circuit board 200, in order to establish an electrical connection. Thus, the signal connector 100 of the present application can establish an electrical connection between the circuit board 200 and the electrical contact part 111, thereby providing the required signal transmission function or power delivery function.

In addition, as shown in the figures, the electrical connection body 130 does not lie on a straight horizontal line, instead being bent in the direction of arrow Y. The shape deformability of the electrical connection body 130 enables the position of the second part 120 to vary within a certain range in the direction indicated by arrow X or arrow Y; this facilitates adjustment of the position of the second part 120, thus ensuring that the first guide pin 123 and second guide pin 124 are matched to the first guide hole and second guide hole, while also ensuring that the electrical pin 121 can be aligned with the electrical interface. In one embodiment, the positions of the electrical pin 121, the first guide pin 123 and the second guide pin 124 are configured such that the error in the positions of the electrical pin 121 and the electrical interface is less than 0.3 mm in the directions indicated by arrow X and arrow Y. For example, the error in position may be 0.05 mm-0.30 mm. Such a configuration helps to ensure that a press-fit is achieved between the electrical pin 121 and the electrical interface.

Since the position of the second part 120 is variable, some of the dimensional tolerances from the first part 110 to the second part 120 need not be taken into account during assembly. Thus, the number of dimensional tolerances that need to be taken into account when manufacturing the signal connector 100 is reduced, thereby lowering the manufacturing cost. In addition, the signal connector 100 of the present application is also improved in terms of convenience of assembly.

The signal connector of the present application has advantages such as being simple and reliable, easy to implement, and convenient to use, and can provide an improved electrical connection solution.

This specification discloses the present application with reference to the drawings, and also enables those skilled in the art to implement the present application, including manufacturing and using any apparatus or system, choosing suitable materials, and using any combined methods. The scope of the present application is defined by the claimed technical solution, and includes other embodiments conceived by those skilled in the art. As long as such other embodiments include structural elements which are not different from the literal language of the claimed technical solution, or such other embodiments include equivalent structural elements which do not differ substantially from the literal language of the claimed technical solution, such other embodiments should be regarded as falling within the scope of protection determined by the technical solution claimed in the present application.

The invention claimed is:

1. A signal connector comprising: a first part (110), having at least one electrical contact part (111), and a first body (112), wherein the first body (112) is configured to be electrically insulating; a second part (120), having at least one electrical pin (121), at least one guide pin, and a second body (122), wherein the second body (122) is configured to be electrically insulating and separate from the first body (112), and the electrical pin (121) is configured to protrude from the second body (122), wherein the at least one guide pin is configured to protrude from the second body (122), and wherein the at least one guide pin and the electrical pin (121) extend in the same direction relative to a surface of the second body (122); and an electrical connection body (130), extending from each electrical contact part (111) to each electrical pin (121), in order to establish an electrical connection between the electrical contact part (111) and the electrical pin (121), wherein the electrical connection body (130) is configured to be deformable and comprises at least two bending parts, and at least part of the electrical connection body (130) is located outside the first part (110) and the second part (120), such that the position of the second part (120) relative to the first part (110) is variable, and wherein at least another part of the electrical connection body (130) is located inside of the first part (110).

2. The signal connector according to claim 1, characterized in that the first part (110) comprises:
a socket interface (115), configured to be suitable for accommodating an electrical plug, the electrical contact part (111) being disposed in the socket interface (115); and
a fitting part (113), configured to match a mounting hole (310) in a housing (300), in order to fix the first part (110) in place,
wherein the second part (120) and the electrical connection body (130) are dimensionally configured for passing through the mounting hole (310) before the fitting part (113) is mated with the mounting hole (310), and wherein the electrical contact part (111), the electrical connection body (130) and the electrical pin (121) are configured as a single piece.

3. The signal connector according to claim 2, characterized in that the electrical connection body (130) is further configured such that:
the second part (120) is rotatable relative to the first part (110) at least within a certain angular range.

4. The signal connector according to claim 2, characterized in that the first part (110) further comprises one or more bolt hole (114), the bolt hole (114) being configured to fix the first part (110) to the housing (300).

5. The signal connector according to claim 1, wherein the at least one guide pin includes:
at least one first guide pin (123), the first guide pin (123) protruding from the second body (122), wherein the first guide pin (123) and the electrical pin (121) are positioned to be spaced apart, and extend perpendicularly relative to a surface of the second body (122).

6. The signal connector according to claim 5, wherein the at least one guide pin includes:
at least one second guide pin (124), the second guide pin (124) protruding from the second body (122), wherein the second guide pin (124) and the electrical pin (121) are positioned to be spaced apart, and extend perpendicularly relative to a surface of the second body (122).

7. The signal connector according to claim 6, characterized in that the second guide pin (124) is configured to have a different cross-sectional shape from that of the first guide pin (123),
wherein the cross-sectional shapes of the first guide pin (123) and the second guide pin (124) are each configured to be one of the following: rectangular, cross-shaped, triangular, circular, elliptical, prism-shaped or a combination thereof.

8. The signal connector according to claim 6, characterized in that the first guide pin (123) and the second guide pin (124) are respectively shape-configured to match a first guide hole and a second guide hole on a circuit board (200), such that a press-fit is formed between the electrical pin (121) and an electrical interface on the circuit board (200), in order to establish an electrical connection between the electrical contact part (111) and the circuit board (200).

9. The signal connector according to claim 1, characterized in that the second part (120) comprises four electrical pins (121), the electrical pins (121) being positioned on the same straight line.

10. The signal connector according to claim 1, characterized in that the electrical connection body (130) is configured to comprise one of the following: a flexible connecting wire and a deformable conductor.

\* \* \* \* \*